United States Patent [19]
Nabeta et al.

[11] Patent Number: 5,764,170
[45] Date of Patent: Jun. 9, 1998

[54] CODE CONVERSION METHOD

[75] Inventors: Masaomi Nabeta, Tokyo; Yoshiyuki Akiyama, Kanagawa, both of Japan

[73] Assignee: Sony Corporation, Tokyo, Japan

[21] Appl. No.: 741,557

[22] Filed: Oct. 31, 1996

[30] Foreign Application Priority Data

Nov. 8, 1995 [JP] Japan ................. 7-289931

[51] Int. Cl.$^6$ ........................... H03M 7/00
[52] U.S. Cl. .................................. 341/95
[58] Field of Search ................... 341/102, 59

[56] References Cited

U.S. PATENT DOCUMENTS

| | | | |
|---|---|---|---|
| 4,488,142 | 12/1984 | Franaszek | 340/347 |
| 4,644,545 | 2/1987 | Gershenson | 371/38 |
| 4,855,742 | 8/1989 | Verboom | 341/102 |
| 5,206,646 | 4/1993 | Sako et al. | 341/95 |

*Primary Examiner*—Brian K. Young

*Attorney, Agent, or Firm*—Frommer Lawrence & Haug LLP; William S. Frommer

[57] ABSTRACT

A code conversion method that may be used for uniquely converting n-bit codes inclusive of those capable of being converted into first and second m-bit data, where n>m. With the present method, a conversion table may be reduced for reducing the size of the conversion circuit. At a step S1, a status bit specifying whether or not a n-bit code next following the n-bit code being converted is a first pre-set codestring. At a step S2, the n-bit codes are split into a first code made up of upper k bits, where 0<k<n, and a second code made up of lower n−k bits. At a step S3, the result of conversion is obtained from a conversion table outputting m-bit data associated with n-bit codes represented by the combination of the first and second codes, with account being taken of the status bit. Second m-bit data are allocated to the combinations of the first and second codes constituting the n-bit code capable of being converted into two m-bit data are allocated to those addresses of the conversion table which are associated with the combinations of the first and second codes excluded by the minimum run-length limitations for the n-bit codes.

8 Claims, 10 Drawing Sheets

INPUT SIGNAL VALUE

| ↓ | TABLE T1a | S | TABLE T2a | S | TABLE T3a | S | TABLE T4a | S |
|---|---|---|---|---|---|---|---|---|
| 0 | 0010000000001001 | 1 | 0100000100100000 | 2 | 0010000000001001 | 1 | 0100000100100000 | 2 |
| 1 | 0010000000010010 | 1 | 0010000000010010 | 1 | 1000000100100000 | 3 | 1000000100100000 | 3 |
| 2 | 0010000100100000 | 2 | 0010000100100000 | 2 | 1000000000010010 | 1 | 1000000000010010 | 1 |
| 3 | 0010000001001000 | 2 | 0100010010000000 | 4 | 0010000001001000 | 2 | 0100010010000000 | 4 |
| 4 | 0010000010010000 | 2 | 0010000010010000 | 2 | 1000000100100000 | 2 | 1000000100100000 | 2 |
| 5 | 0010000000100100 | 2 | 0010000000100100 | 2 | 1001001000000000 | 4 | 1001001000000000 | 4 |
| 6 | 0010000000100100 | 3 | 0010000000100100 | 3 | 1000100100000000 | 4 | 1000100100000000 | 4 |
| 7 | 0010000001001000 | 3 | 0100000000010010 | 1 | 0010000001001000 | 3 | 0100000000010010 | 1 |
| 8 | 0010000010010000 | 3 | 0010000010010000 | 3 | 1000010010000000 | 4 | 1000010010000000 | 4 |
| 9 | 0010000100100000 | 3 | 0010000100100000 | 3 | 1001001000000001 | 1 | 1001001000000001 | 1 |
| 10 | 0010010010000000 | 4 | 0010010010000000 | 4 | 1000100100000001 | 1 | 1000100100000001 | 1 |
| 11 | 0010001001000000 | 4 | 0010001001000000 | 4 | 1000000010010000 | 3 | 1000000010010000 | 3 |
| 12 | 0010010010000001 | 1 | 0010010010000001 | 1 | 1000000010010000 | 2 | 1000000010010000 | 2 |
| 13 | 0010001001000001 | 1 | 0010001001000001 | 1 | 1000010010000001 | 1 | 1000010010000001 | 1 |
| 14 | 0010000001001001 | 1 | 0100000000100100 | 3 | 0010000001001001 | 1 | 0100000000100100 | 3 |
| 15 | 0010000100100001 | 1 | 0010000100100001 | 1 | 1000001001000001 | 1 | 1000001001000001 | 1 |
| 16 | 0010000010010001 | 1 | 0010000010010001 | 1 | 1000000100100001 | 1 | 1000000100100001 | 1 |
| 17 | 0010000000100010 | 1 | 0010000000100010 | 1 | 1000001001000000 | 4 | 1000001001000000 | 4 |
| 18 | 0001000000001001 | 1 | 0100000010010000 | 2 | 0001000000001001 | 1 | 0100000010010000 | 2 |
| 19 | 0010000000010001 | 1 | 0010000000010001 | 1 | 1001000100000000 | 4 | 1001000100000000 | 4 |
| 20 | 0001000000010010 | 1 | 0001000000010010 | 1 | 1000100010000000 | 4 | 1000100010000000 | 4 |
| : | : | | : | | : | | : | |
| 248 | 0000100100001001 | 1 | 0100010010010001 | 1 | 0000100100001001 | 1 | 0100010010010001 | 1 |
| 249 | 0000100001000001 | 1 | 0000100001000001 | 1 | 1000010000001001 | 1 | 1000010000001001 | 1 |
| 250 | 0000100010010010 | 1 | 0000100010010010 | 1 | 1000001000000010 | 1 | 1000001000000010 | 1 |
| 251 | 0000010001000010 | 1 | 0000010001000010 | 1 | 1000000100000001 | 1 | 1000000100000001 | 1 |
| 252 | 0000010010001001 | 1 | 0100010000100010 | 1 | 0000010010001001 | 1 | 0100010000100010 | 1 |
| 253 | 0000010000100001 | 1 | 0000010000100001 | 1 | 0100100010001001 | 1 | 0100100010001001 | 1 |
| 254 | 0000001001000100 | 2 | 0100010000010001 | 1 | 1001000000010000 | 2 | 0100010000010001 | 1 |
| 255 | 0000001000001000 | 2 | 0100001000010010 | 1 | 1000100100010000 | 2 | 0100001000010010 | 1 |

INPUT SIGNAL VALUE

| ↓ | TABLE T1b | S | TABLE T2b | S | TABLE T3b | S | TABLE T4b | S |
|---|---|---|---|---|---|---|---|---|
| 0 | 0000010010000000 | 4 | 0000010010000000 | 4 | 0100100001001000 | 2 | 0100100001001000 | 2 |
| 1 | 0000100100000000 | 4 | 0000100100000000 | 4 | 0100100001001000 | 3 | 0100100001001000 | 3 |
| 2 | 0001001000000000 | 4 | 0001001000000000 | 4 | 0100100000001001 | 1 | 0100100000001001 | 1 |
| 3 | 0000001001000000 | 4 | 0100010000000001 | 1 | 1000001000000000 | 4 | 0100010000000001 | 1 |
| 4 | 0000000100100000 | 3 | 0100100000000010 | 1 | 1001000000000100 | 3 | 0100100000000010 | 1 |
| 5 | 0000000010010000 | 3 | 0100001000000000 | 4 | 1001000000100100 | 3 | 0100001000000000 | 4 |
| 6 | 0000000001001000 | 3 | 0100100000000100 | 2 | 1001000001001000 | 3 | 0100100000000100 | 2 |
| 7 | 0000000001001000 | 2 | 0100000100000000 | 4 | 1001000000000100 | 2 | 0100000100000000 | 4 |
| 8 | 0000000010010000 | 2 | 0100100010010000 | 3 | 1001000000100100 | 2 | 0100100010010000 | 3 |
| 9 | 0000000100100000 | 2 | 0100100000100100 | 2 | 1001000001001000 | 2 | 0100100000100100 | 2 |
| 10 | 0000010001000000 | 4 | 0000010001000000 | 4 | 1001001001000000 | 4 | 1001001001000000 | 4 |
| : | : | | : | | : | | : | |
| 84 | 0010010000100100 | 2 | 0010010000100100 | 2 | 1000100000001000 | 2 | 1000100000001000 | 2 |
| 85 | 0010010010010000 | 2 | 0010010010010000 | 2 | 0100010001001001 | 1 | 0100010001001001 | 1 |
| 86 | 0000000100000100 | 2 | 0100001000100100 | 2 | 1000100001000100 | 2 | 0100001000100100 | 2 |
| 87 | 0000000100100100 | 2 | 0100010001000100 | 2 | 1000100010001000 | 2 | 0100010001000100 | 2 |

FIG.2

| | UPPER ORDER | |
|---|---|---|
| | 8 BITS | 5-BIT ADDRESS $A_{U5}$ |
| $Y_A$ | 0 0 0 0 0 0 0 0 | 0 |
| | 1 0 0 0 0 0 0 0 | 1 |
| | 0 1 0 0 0 0 0 0 | 2 |
| | 0 0 1 0 0 0 0 0 | 3 |
| | 0 0 0 1 0 0 0 0 | 4 |
| | 1 0 0 1 0 0 0 0 | 5 |
| | 0 0 0 0 1 0 0 0 | 6 |
| | 0 1 0 0 1 0 0 0 | 7 |
| | 1 0 0 0 1 0 0 0 | 8 |
| | 0 0 0 0 0 1 0 0 | 9 |
| | 0 0 1 0 0 1 0 0 | 10 |
| | 0 1 0 0 0 1 0 0 | 11 |
| | 1 0 0 0 0 1 0 0 | 12 |
| $Y_B$ | 1 0 0 1 0 0 1 0 | 13 |
| | 0 0 0 0 0 0 1 0 | 14 |
| | 0 0 0 1 0 0 1 0 | 15 |
| | 0 0 1 0 0 0 1 0 | 16 |
| | 0 1 0 0 0 0 1 0 | 17 |
| | 1 0 0 0 0 0 1 0 | 18 |
| $Y_C$ | 0 0 0 0 0 0 0 1 | 19 |
| | 0 0 0 0 1 0 0 1 | 20 |
| | 0 0 0 1 0 0 0 1 | 21 |
| | 0 0 1 0 0 0 0 1 | 22 |
| | 0 1 0 0 0 0 0 1 | 23 |
| | 0 1 0 0 1 0 0 1 | 24 |
| | 1 0 0 0 0 0 0 1 | 25 |
| | 1 0 0 0 1 0 0 1 | 26 |
| | 1 0 0 1 0 0 0 1 | 27 |

FIG.8A

| | | LOWER ORDER | |
|---|---|---|---|
| | | 8 BITS | 5-BIT ADDRESS $A_{L5}$ |
| $X_A$ | | 0 0 0 0 0 0 0 0 | 0 |
| | $W_1$ | 0 0 0 0 0 1 0 0 | 1 |
| | | 0 0 0 0 1 0 0 0 | 2 |
| | $W_2$ | 0 0 0 1 0 0 0 0 | 3 |
| | | 0 0 1 0 0 0 0 0 | 4 |
| | | 0 0 1 0 0 1 0 0 | 5 |
| | | 0 0 0 0 0 0 0 1 | 6 |
| | | 0 0 0 0 0 0 1 0 | 7 |
| | | 0 0 0 0 1 0 0 1 | 8 |
| | | 0 0 0 1 0 0 0 1 | 9 |
| | | 0 0 0 1 0 0 1 0 | 10 |
| | | 0 0 1 0 0 0 0 1 | 11 |
| | | 0 0 1 0 0 0 1 0 | 12 |
| $X_B$ | $W_3$ | 0 1 0 0 0 0 0 0 | 13 |
| | | 0 1 0 0 0 1 0 0 | 14 |
| | | 0 1 0 0 1 0 0 0 | 15 |
| | | 0 1 0 0 0 0 0 1 | 16 |
| | | 0 1 0 0 0 0 1 0 | 17 |
| | | 0 1 0 0 1 0 0 1 | 18 |
| $X_C$ | | 1 0 0 0 0 0 0 1 | 19 |
| | | 1 0 0 0 0 0 0 0 | 20 |
| | $W_4$ | 1 0 0 0 0 1 0 0 | 21 |
| | | 1 0 0 0 1 0 0 0 | 22 |
| | | 1 0 0 1 0 0 0 0 | 23 |
| | | 1 0 0 0 0 0 1 0 | 24 |
| | | 1 0 0 0 1 0 0 1 | 25 |
| | | 1 0 0 1 0 0 0 1 | 26 |
| | | 1 0 0 1 0 0 1 0 | 27 |

FIG.8B

CODE CONVERSION METHOD

BACKGROUND OF THE INVENTION

1. Field of the Invention

This invention relates to a code conversion method for demodulating and reproducing modulated signals, such as modulated digital audio signals, digital video signals or digital data signals. More particularly, it relates to a code conversion method for demodulating a signal modulated by a signal modulation method applied to a mastering device for a read-only optical disc or a recording/reproducing apparatus for a write-once or an overwrite type optical disc.

2. Description of the Related Art

When recording digital signals, such as digital speech, video signals or data, on a recording medium, error detection and correction codes are first appended to the digital signals and the resulting signal is supplied to a modulation circuit for conversion to a code appropriate for the characteristics of a recording/reproducing system (channel coding).

An optical disc, such as a compact disc, is a recording medium having high universality as a recording medium for a computer or as a package medium for video information. In an optical disc system, signals recorded on a reflective surface of an optical disc are reproduced via a transparent substrate thereof having a thickness on the order of 1.2 mm. On the optical disc is recorded the information, such as the digitized audio signal, video signal or digital data. At this time, error detection and correction codes are first appended to digital signals, and the resulting signal is supplied to a modulation circuit wherein it is converted by so-called channel coding into codes appropriate for the characteristics of the recording/reproducing system.

The gist of the signal format of the compact disc (CD) system is:

sampling frequency, 44.1 kHz;

number of quantization bits, 16 bits (linear);

modulation system, EFM;

channel bit rate, 4.3218 Mb/s;

error correction system, CIRC; and data transmission rate, 2.034 Mb/s.

The modulation system employed is an 8-to-14 modulation system, that is EFM system.

The EFM is a modulation system in which input 8-bit codes are converted into 14-channel bit codes, 14 channel bit synchronization signals and 14 channel bit sub-codes are appended to the 14 channel bit codes, the neighboring codes are connected by 3-channel bit merging bits and the resulting string is recorded by NRZI recording system.

With this EFM system, the time duration of the high-level or low-level signal of the NRZI recording waveform (recording wavelength) is necessarily not less than 3T and not more than 11T (the shortest recording wavelength is 3T and the longest recording wavelength is 1T) where T is a period of a channel clock, such as a period of, for example, 4.3218 MHZ. The above rule is hereinafter referred to as a 3T–11T rule of EFM.

With the conventional EFM system, in which the minimum run-length is limited to 2, the merging 2 bits suffice if it is only necessary to satisfy the limitation of the run-length. If the number of the merging bits can be reduced to 2, the data recording density can be improved by a factor of 17/16 without changing the physical size of the recording wavelength.

The present Assignee has already proposed in JP Patent Kokai JP-A-6-157175 a signal modulation method and a signal modulation circuit in which a codestring of input M bits, such as 8 bits, can be directly converted into N channel bits, such as 16 channel bits, without using the above-mentioned merging bits, for diminishing ill effects on DSV control and for enabling sufficient suppression of low-frequency components.

With this new modulation system, there are occasions wherein the modulated 16-bit codes and the pre-modulation 8-bit source data are not associated with each other in a one-for-one correspondence, such that, for converting 16-bit codes into 8-bit data for demodulation, there is required, in addition to the 16-bit code, now to be converted, 1 bit of status data which is determined by a 16-bit code immediately following the firstly-stated 16-bit code. That is, among the modulated 16-bit codes, there are those codes that can be converted into two types of 8-bit data. In such case, one of these two types of the source data is selected depending on the value of the status bit. This status bit becomes 1 when at least one of the first and the thirteenth bits as counted from the MSB of the next 16 bit code becomes 1.

Meanwhile, with this new modulation system, the conversion table used in a modulator is made up of input 16 bits and one status bit, totalling 17 bits, and 8-bit data are accessed and outputted with these 17 bits as addresses, so that the capacity of 8×2=1048576 bits, that is 1M bits, is required for a ROM.

Since the size of the conversion table used for the demodulator is as large as 1M bits, the demodulator circuit configuration is increased in size, thus raising the cost.

It is therefore an object of the present invention to provide a code conversion method whereby the conversion table for converting n-bit codes into m-bit codes may be reduced thereby reducing the size of a demodulation circuit employing such conversion table and thereby reducing the cost.

A code conversion method for uniquely converting n-bit codes into m-bit data, where n>m, said n-bit codes including codes that can be converted into first and second m-bit data, comprises: a first step of generating a status bit specifying whether or not an n-bit code immediately following the n-bit code now being converted is a first pre-set code; a second step of splitting said n-bit code into a first code consisting of upper k bits, where 0<k<n, and a second code consisting of lower n−k bits; and a third step of producing the result of conversion from a conversion table, with account being taken of said status bit, said conversion table outputting an m-bit data associated with said n-bit code, represented by the combination of said first code and said second code; said conversion table being so constructed that addresses are affixed to said first code and to said second code and said first m-bit data is allocated for a combination of said first code and said second code constituting an n-bit code capable of being converted into said two m-bit data, said conversion table being so constructed that said second m-bit data is allocated to addresses among the addresses of said conversion table associated with the combinations of said first and second codes excluded by the minimum run-length limitation of said n-bit codes for a combination of said first code and said second code constituting an n-bit code capable of being converted into said two m-bit data.

In this manner, the conversion table may be utilized effectively and, if the method is used in a modulator, the circuit structure may be reduced for lowering production cost.

Specifically, the values of n, m and k may be so set that n=16, m=8 and k=n−m=8. In this case, a status bit specifying whether or not a 16-bit code immediately following the 16-bit code now being converted is a first pre-set code is generated, and the 16-bit code is split into a first code consisting of upper 8 bits, and a second code consisting of lower 8 bits. The result of conversion is obtained, with account being taken of said status bit, from a conversion table outputting an 8-bit data associated with the 16-bit data, represented by the combination of the first code and the second code. In the conversion table, addresses are affixed to the first code and to the second code and the first 8-bit data is allocated for a combination of the first code and the second code constituting a 16-bit code capable of being converted into the two 8-bit data. The second 8-bit data is allocated to addresses among the addresses of the conversion table associated with the combinations of the first and second codes excluded by the minimum run-length limitation of the 16-bit codes for a combination of the first code and the second code constituting a 16-bit code capable of being converted into the two 8-bit data.

The 16-bit code and the status bit, totalling 17 bits, are converted into upper 5 address bits and lower 5 address bits, totalling 10 address bits, which can then be converted into 8-bit data. For the 10 to 8 bit conversion table, it is only necessary to use a ROM having a memory capacity of X $2^{10}=8192$ bits, that is 8 kbits.

BRIEF DESCRIPTION OF THE DRAWINGS

FIG. 2 illustrates a specified embodiment of a conversion table used for the embodiment of FIG. 1.

FIGS. 8A and 8B are conversion tables for converting upper 8 bits and lower 8 bits of code bits into upper 5 bit addresses $A_{U5}$ and lower 5 bit addresses $A_{V5}$.

DESCRIPTION OF THE PREFERRED EMBODIMENTS

Figure 1:
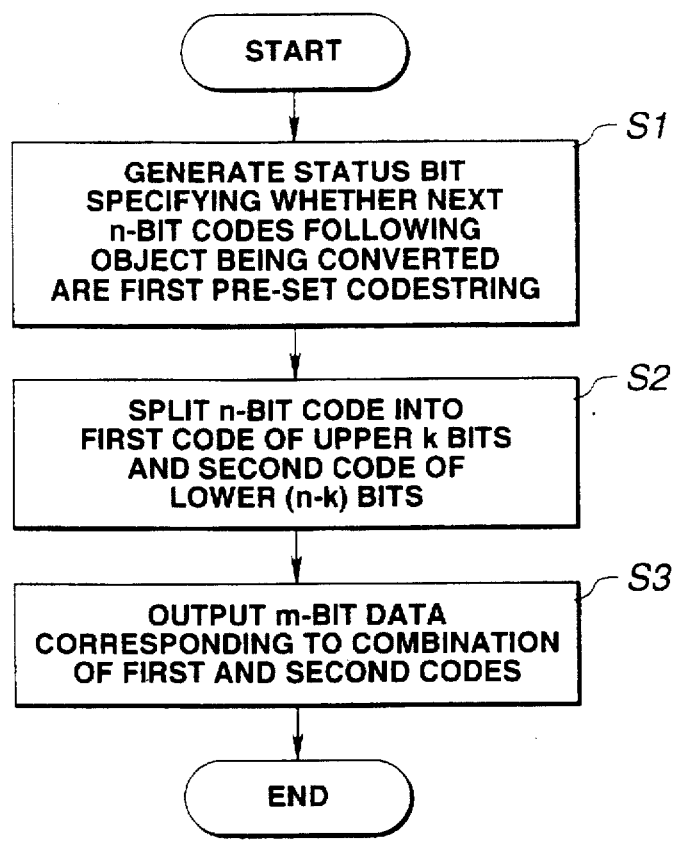
FIG. 1 is a flowchart for illustrating the basic structure of an embodiment of the present invention.

Before proceeding to description of preferred embodiments of the code conversion method according to the present invention, an example of splitting a 16-bit code (codestring) into a first code of upper 8 bits and a second code of lower 8 bits and representing these first and second codes each by 5 bits, totalling 10 bits, and subsequently employing a conversion table, is explained.

In splitting a 16-bit code into the first code of upper 8 bits and the second code of lower 8 bits, since the minimum run length is 2, that is since the minimum distance between transition in a recording waveform is not less than 3T, there are only 28 8-bit patterns. Therefore, by converting upper and lower 8 bits of a 16-bit code into respective 5 bits, the 16-bit code may be represented by 10 bits.

These 10 bits are added to a status bit, obtained from the next 16 bit code contiguous with the current 16 bit code, to give the 11-bit information, which is converted into 8-bit data. The reason is that, among the 10-bit information data representing 16-bit code, there are data that can be converted into two types of 8-bit data, such that is it necessary to select one of these two types of the 8-bit data depending on the value of the status bit. This can be expressed in such a manner that two 10 to 8 bit conversion tables are used and one of these conversion tables is used depending on the value of the status bit.

With this technique, a ROM having a capacity of $8 \times 2^{11} = 16384$ bits, or 16 kbits, is required as a conversion table for converting a 11-bit input into an 8-bit output. Since the capacity which is 1/64 times as large as the capacity of 1M bits of the conversion table used for converting 16+1 bits into 8 bits in the conventional technique, the circuit scale may be reduced to assure lower cost.

The code conversion method of the present invention resides in further improving this technique for assuring that only one conversion table for converting 10 bits into 8 bits suffices.

That is, the preferred embodiment of the present invention presupposes a code conversion method for uniquely converting 16-bit codes including those that can be converted into two 8-bit data, that is first and second 8-bit data, into 8-bit data. In more general terms, the preferred embodiment of the present invention presupposes a code conversion method for uniquely converting n-bit codes including those that can be converted into two m-bit data, that is first and second m-bit data, into m-bit data, where n>m. Specifically, the preferred embodiment of the present invention resides in the following three steps:

At step S1 of FIG. 1, a status bit is generated, specifying whether or not the n-bit code immediately following n-bit code now to be converted is a pre-set first codestring. At the next step S2, the n-bit code is divided into first codes consisting of upper k bits, where 0<k<n, and second codes consisting of lower (n−k) bits. At the next step S3, the result of conversion is obtained from a conversion table outputting m-bit data which, account being taken of the aforementioned status bit, are represented by the combination of the aforementioned first and second codes and are associated with the n-bit codes.

In the conversion table, addresses are allocated to the first and second codes, and the aforementioned first m-bit code data are allocated to the combination of the first and second codes constituting the n-bit code capable of being converted into two m-bit data.

A specific example with n=16, m=8 and n−k=8 will be explained in detail.

The 16-bit codes, employed in this specific example, are obtained by modulating original 8-bit source data by a modulation method as proposed in our copending JP Patent Application No-6-5157175. For demodulating the 16-bit codes, produced by this modulation method, into the original 8-bit data, the code conversion method, embodying the present invention, is employed.

The modulation method disclosed in JP Patent Application No-6-157175 for converting the 8-bit source data into 16-bit codes, and the corresponding demodulation method, are now explained.

In general, the signal modulation method presupposes converting an input m-bit codestring into codes of n-channel bit codes, and directly connecting the n-channel bit pattern with the next following n-channel bit pattern, where m and n are integers, with m<n. The conversion table for converting the m-bit channel bit source data into the n-channel bit pattern is partially duplicated and the duplicated portion is constructed so that the amount of the digital sum variations or the digital sum values of corresponding sets of codes are opposite in sign and the absolute values thereof are close to each other.

FIG. 2 shows an example of such conversion table.

Referring to FIG. 2, the conversion table is made up of a plurality of, for example, four, unit tables $T_1$, $T_2$, $T_3$ and $T_4$, each of which has a duplicated portion. That is, if a table of a set of codes (channel bit patterns) associated with all input signal values in a given unit table is Ta, its portion is duplexed into a table Tb. In the illustrative example of FIG. 2, 88 codes for 0 to 87 of the input signal values are duplicated. In the present specification, the table Ta and Tb are termed as front and back tables, respectively.

Therefore, in the illustrative example of FIG. 2, the conversion table is constituted by four tables (front tables) $T_{1a}$, $T_{2a}$, $T_{3a}$, $T_{4a}$ each made up of 256 16-bit codes, or 256 16-channel bit patterns, and tables of 88 16-channel bit patterns (back tables) $T_{1b}$, $T_{2b}$, $T_{3b}$, $T_{4b}$. The 88 16-channel bit patterns of the back tables $T_{1b}$, $T_{2b}$, $T_{3b}$, $T_{4b}$ are duplexed with 88 16-channel bits for the input signal values of 0 to 87 of the respective tables $T_{1a}$, $T_{2a}$, $T_{3a}$, $T_{4a}$.

In the embodiment of the present invention, the duplexed portions of the conversion tables, that is the 16-bit codes for the input signal values from 0 to 87 of the Tables $T_{1a}$, $T_{2a}$, $T_{3a}$, $T_{4a}$, and the 16-bit codes of the conversion tables $T_{1b}$, $T_{2b}$, $T_{3b}$, $T_{4b}$, are so designed that the amounts of the digital sum variations or the digital sum values of corresponding sets of codes are opposite in sign and the absolute values thereof are close to each other.

An illustrative example of the signal modulation method employing the conversion tables of FIG. 2 is now explained.

In the illustrative example, as shown in FIG. 2, an input 8-bit signal is converted into 16-bit codes. In the conventional so-called EFM system, the input 8-bit signal is converted into 14 information bits, which are connected to the neighboring 14 information bits by 3 merging bits. In the present illustrative example, the merging bits are not used and the input 8-bit signal is directly converted into 16-bit codes. This conversion system is termed the 8 to 16 modulation system. This 8 to 16 modulation also meets the conditions for EFM requiring that the number of "0"s between "1" and "1" is not less than 2 and not more than 10 (3T–11T rule).

In EFM, there is only one table used for converting the input 8-bit codes into 14-bit codes. In the 8 to 16 modulation system, there are plural types of tables for converting the input 8-bit signals into 16-bit codes. In the illustrative example of FIG. 2, four types of unit tables $T_1$, $T_2$, $T_3$, $T_4$ are used.

The "status values" used for classifying the unit tables are explained. It should be noted that the status value is different in meaning from the status data or status bit used for code conversion during demodulation in the above-described embodiment of the present invention.

This status value plays the role of an index for determining which of the conversion tables should be used in converting the input 8-bit signal into 16-bit codes. Therefore, the same number of status values is used as the number of the unit tables of the conversion table. Specifically, there are four status values '1' to '4' in association with the four types of the unit tables $T_1$, $T_2$, $T_3$ and $T_4$.

The status values are changed each time an 8-bit symbol is converted into a 16-bit code. If the 16-bit code ends with "1" or with "10", the status value is changed to '1'. If the 16-bit codes end with not less than 2 and not more than 5 contiguous "0"s, the status value is changed to "2" or "3". If the 16-bit codes end with not less than 6 and not more than 9 contiguous "0"s, the status value is changed to "4".

The tables for converting the input 8-bit signals into 16-bit codes have the following features.

The unit table $T_1$ used for the status value of '1' meets the condition that the number of "0"s between "1" and "1" be not less than 2 and not more than 10 (3T–11T rule). Therefore, it is constituted exclusively by 16-bit codes beginning with a minimum of two "0"s. The reason is that the 16-bit codes modulated before the status value is changed to '1' end with "1" or "10".

For the similar reason, the unit table $T_2$ or $T_3$, used when the status value is '2' or '3', is constituted exclusively by the 16-bit codes beginning with 0 to five contiguous "0"s. The unit table $T_2$, used when the status value is '2', is constituted by codes in which, with the MSB being the first bit, both the first and the thirteenth bits are "0". The unit table $T_3$, used when the status value is '3', is constituted by codes in which one or both of the first and the thirteenth bits are "0".

The unit table $T_4$, used for the status value of '4', is constituted exclusively by 16-bit codes beginning with "1" or "01".

It is noted that there exist a 16-bit code that can be used in common for two different status values. For example, a 16-bit code beginning with three consecutive "0"s and of which the first and the thirteenth bits are "0" may be used in conjunction with the status value equal to '1' and with the status value equal to '2'. For such codes, the conversion table should be formulated so that the corresponding 8-bit input signal is necessarily of the same value for avoiding possible decoding failure.

The 16-bit codes whose status value is changed next to '2' or to '3' can be allocated for two types of totally different values of the input 8-bit signal. In this case, decoding cannot be uniquely performed if only the code is referred to. However, correct decoding can be achieved by necessarily setting the value changed next to '2', '3' for one or the other of the states of the input 8-bit signal, as will be discussed subsequently.

For respective codes of all of the unit tables, another table is provided for specifying to which one of '1' to '4' the next status value is changed when the input 8-bit signal is converted to the code. If the 16-bit code ends with not less than 2 and not more than 5 contiguous "0"s, it cannot be determined whether the status value is changed next to '2' or to '3' if only reference is had to code features. However, the next status value can be uniquely determined by having reference to this table. Meanwhile, after the synchronization pattern, the status value becomes necessarily equal to '1'.

In the example of FIG. 2, the next status value is indicated by S to constitute tables including these status values S indicating the directions of change.

Using these tables, the modulator modulates the input 8-bit symbols to 16-bit codes. The modulator stores the current status values in its internal memory and gets a table to be referred to from these states. The 8-bit signal to be entered is converted by this table into a 16-bit code for modulation. The next status value is found from the table and stored for realizing the table to be referred to at the time of the next conversion. An example of the actual hardware constitution will be explained subsequently.

The manner of controlling the digital sum variation or digital sum value DSV is now explained.

It is first scrutinized how many for each status value there are 16-bit codes which satisfy the run-length limitation (3T–11T rule) and which can be used impeccably. For inhibiting occurrence of a pattern including two repetitive patterns of the same 11T as that of the frame synchronization pattern, those 16-bit codes including an array of 10 "0"s are followed by "1" followed in turn by an array of five "0"s. The reason is that if the code is followed by a 16-bit code beginning with an array of five consecutive "0"s, two repetitive patterns of 11T are produced. If, after conversion into 16-bit codes, the status value is changed to "2" or to "3", the codes are usable in two ways, so that these codes are counted twice.

The results of calculations reveal that there are 344 16-bit codes that can be used if the status value is "1", 345 16-bit codes that can be used if the status value is "2", 344 16-bit codes that can be used if the status value is "3", and 411 16-bit codes that can be used if the status value is "4". Since the input signal is of 8 bits, 256 codes suffice, so that at least 88 codes become redundant for each status value. These 88 redundant codes are used for DSV control. That is, redundant codes are used for separately providing a table having 88 entries, that is a back table. In the present embodiment, the back table is constituted for signal values of "0" to "87" of the input 8-bit signal.

A basic example of receiving the signal modulated in accordance with the above-described modulation system for demodulating the received signal to the original 8-bit signals is explained.

With the conventional modulation system for EFM, the 14-bit information signals and the 8-bit input signals are associated with each other in complete one-for-one correspondence, so that back conversion from the 14-bit information signals to 8-bit signals can be realized impeccably.

Figure 3:
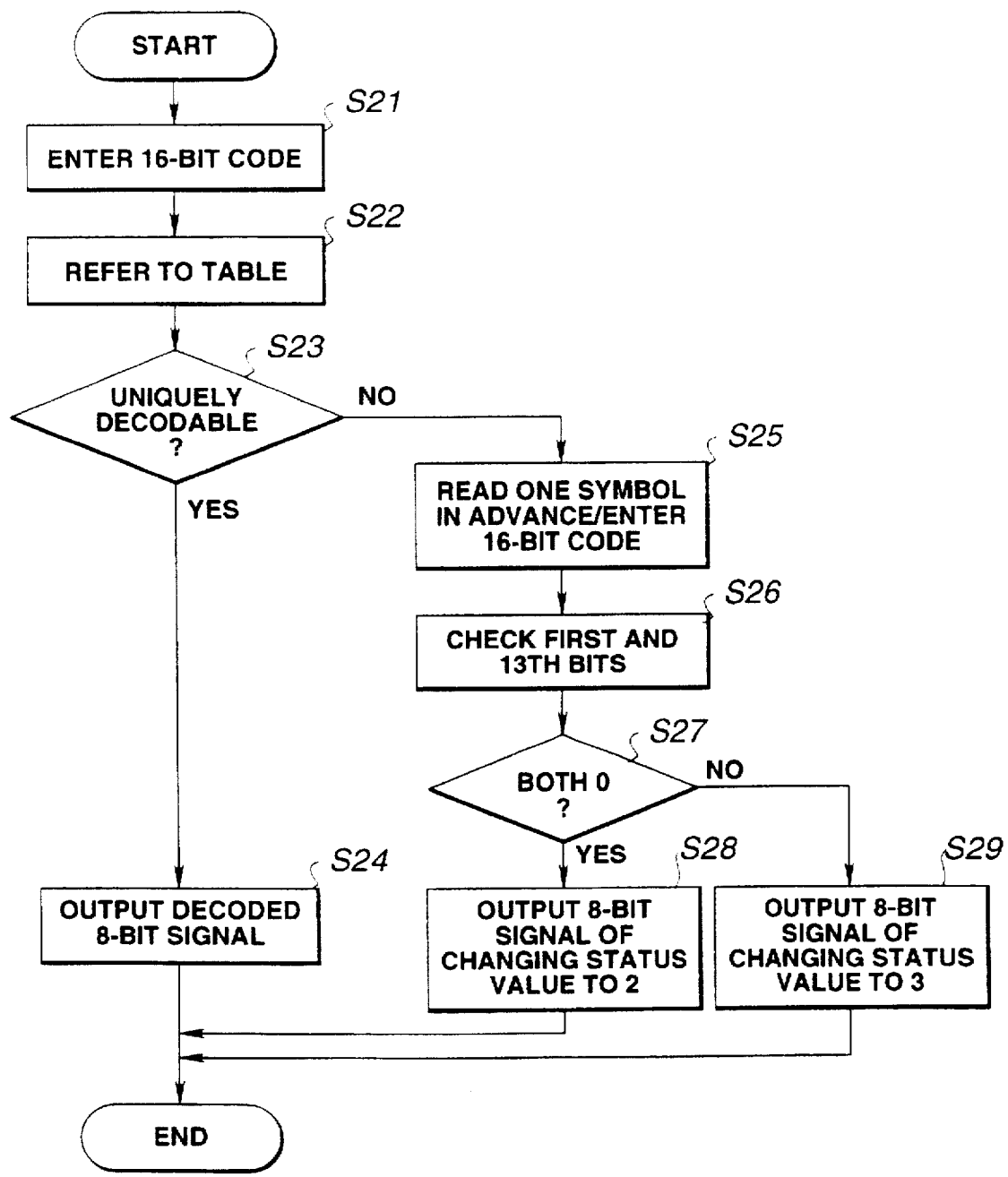
FIG. 3 is a flowchart showing an illustrative example of an algorithm of the signal demodulation method according to the present invention.

In the above-described specific example of the modulation system, there are occasions wherein the same 16-bit codes are allocated to different 8-bit input signals. Therefore, the demodulator cannot realize back conversion on reception simply of a 16-bit code. If the demodulator of the present embodiment cannot realize back conversion at a stage when it receives the 16-bit code, it receives one more 16-bit code and performs back conversion based on the two received codes. FIG. 3 shows an algorithm of the demodulation system of the present example.

The main points of the demodulation algorithm shown in FIG. 3 are hereinafter explained.

The 16 bit code that can be assigned in common to two totally different values of the input 8-bit signal are exclusively those codes whose status values are changed next to "2" or to "3". One of such 16-bit codes necessarily transfers to the next status value of "2", while the other 16-bit code necessarily transfers to the next status value of "3". The table used when the status value is "2" is made up of codes in which the first and the thirteenth bits are both "0", with the MSB being the first bit, while the table used when the status value is "3" is made up of codes in which one or both of the first and the thirteenth bits are "1", with the MSB being the first bit.

It follows from these conditions that, if, with the 16-bit code now to be back-converted, the status value is changed to "2", the next 16-bit code is such a code in which the first and the thirteenth bits are "0", whereas, if, with the 16-bit code now to be back-converted, the status value is changed to "3", the next 16-bit code is such a code in which one or both of the first and the thirteenth bits are "1". Therefore, if the demodulator on reception of a 16-bit code cannot effect back-conversion, it receives one more 16-bit code, at step S25 in FIG. 3, and checks the first and the thirteenth bits of the newly received code, at step S26. It is checked at step S27 whether bits are "0". If both bits are found to be "0", the 16-bit code being back-converted is such a code the status value for which is changed next to "2". If one or both of the bits are "1", the 16-bit code being back-converted is such a code the status value for which is changed next to "3". Thus the 16-bit code can be back-converted uniquely, as at steps S28 and S29.

This operation is explained by taking an example from the conversion table shown in FIG. 2.

In the table $T_{1a}$ (front table) of the unit table $T_1$ in the conversion table of FIG. 2, having the status value of 1, the 16-bit codes for the 8-bit input signals "5" and "6" are both "0010 0000 0010 0100". Therefore, the decoding cannot perform back conversion even if it receives a code "0010 0000 0010 0100". In this case, the demodulating unit reads one more symbol. If the 16-bit thus read is "0010 0000 0000 1001", as an example, since the 13th bit thereof is "1", the 16 bit code is the code converted when the status value is "3". If a given 16-bit code is the same "0010 0000 0010 0100" code, but if the input signal value is "5", the status value is then changed to "2", whereas, if the input signal value is "6", the status value is then changed to "3". Thus the demodulating unit can judge that the input signal value is that having the next status value of "3", that is "6", so that it can decode the signal correctly.

In the flowchart of FIG. 3, a 16-bit code is entered at step S21, and reference is had to the table at step S22. If it is found at step S23 that decoding is feasible uniquely, processing transfers to step S24 where the decoded 8-bit signal can be outputted.

Figure 4:
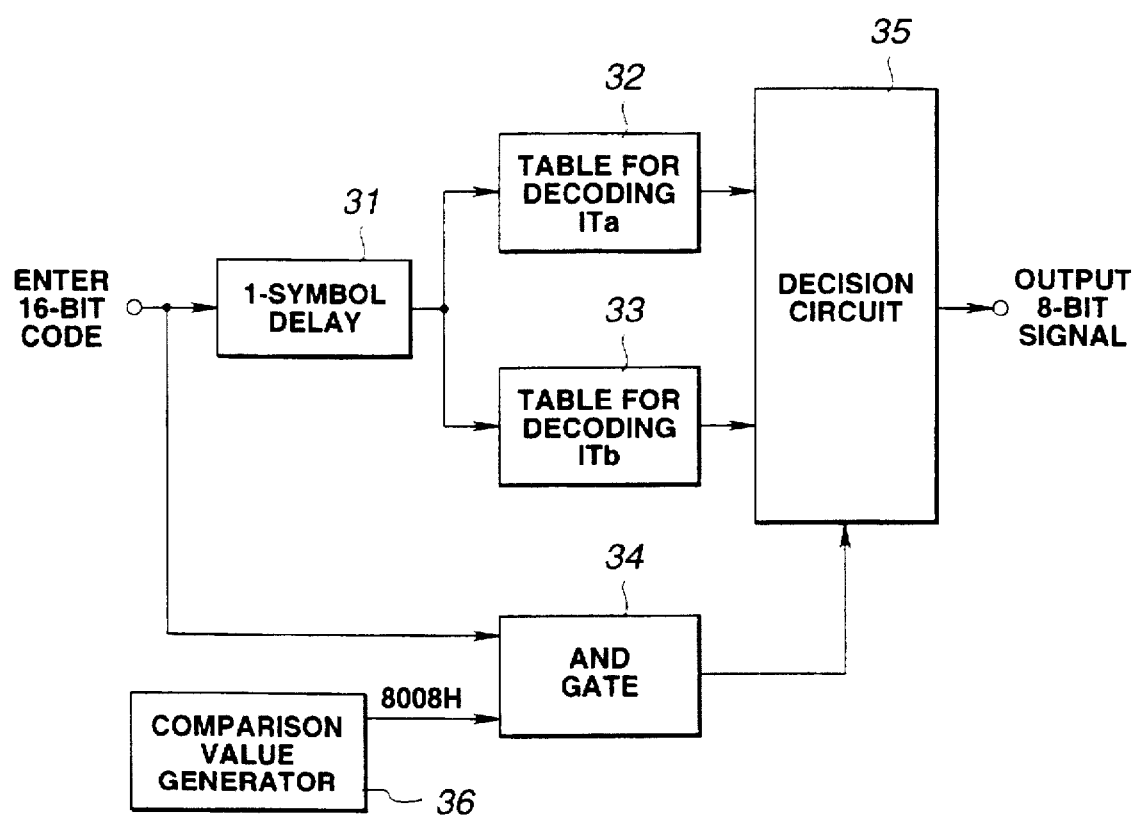
FIG. 4 is a block diagram showing an illustrative structure of a signal demodulator embodying the present invention.

FIG. 4 shows, in a block diagram, an illustrative structure of a signal decoder embodying the present invention.

In this figure, a 16-bit input code enters a one-symbol delay circuit 31 and an AND gate 34.

The one-symbol delay circuit 31 delays the input 16-bit code by one symbol. The 16-bit code, thus delayed by one symbol, is sent to a decoding table ROM 32 where a first table $IT_a$ for decoding is recorded, and to a decoding table ROM 33 where a second table $IT_b$ for decoding is recorded.

The decoding table ROM 32, in which the first table for decoding $IT_a$ has been recorded, receives the 16-bit code and back-converts it to output an 8-bit signal. As for a code of the type which cannot be uniquely back-converted on reception only of a corresponding 16-bit code, the modulating unit first outputs the code and then outputs an 8-bit signal whose status value is changed next to '2'. The 8-bit signal value, thus outputted, is supplied to a decision circuit 35.

Similarly to the decoding table ROM 32, the decoding table ROM 33, in which has been recorded the second table for decoding ITb, receives the 16-bit code and back-converts it to output an 8-bit signal. However, not all 16-bit codes that are back-converted by the decoding table ROM 33. On reception of a 16-bit code that can be uniquely back-converted, the decoding table ROM 33 outputs nothing, or outputs specified data. On reception of a 16-bit code of the type which cannot be back-converted by itself, the demodulating unit outputs this code and outputs the 8-bit signal value whose status is changed to "3". The 8-bit signal value, thus outputted, is supplied to the decision circuit 35.

The AND gate 34 performs an AND operation on the input 16-bit code and a 16-bit code "1000 0000 0000 1000" from a comparison value generating circuit 36 which is "8008" in hexadecimal notation, in order to check the code of the first and thirteenth bits of the input 16-bit code. If all of the bits of the numerical value of the 16-bit AND output are "0", the AND gate 34 outputs "0". Otherwise, the AND gate outputs "1". Since "8008" is such a code in which the first bit and the thirteenth bit as counted from the first bit (MSB) are "1" and the remaining bits are "0", the output of the AND gate 34 is "0" and "1" if both the first and the thirteenth bit of the input 16-bit code are "0" and if one or both of the first and the thirteenth bit of the input 16-bit code are "1", respectively.

The decision circuit 35 receives the 8-bit signal value supplied from the first table ROM for decoding 32 and the second table ROM for decoding 33 and the signal supplied from the AND gate 34. If the 8-bit signal value is not supplied from the second table ROM for decoding 33, or if special data is sent therefrom, it indicates that the input 16-bit code has been uniquely decoded to an 8-bit signal value. Thus the decision circuit 35 directly outputs the 8-bit signal value sent from the first table ROM for decoding 32 as an output signal. If then an 8-bit signal is supplied from the second table ROM for decoding 33, it indicates that the input 16 bit code has not been decoded uniquely to an 8-bit signal value. Since the data supplied from the first table ROM for decoding 32 and the second table ROM for decoding 33 have been passed through the one-symbol delay circuit 31, the 16-bit code entering the AND gate 34 is a code read one symbol before. Therefore, if the 16-bit code entering the AND gate 34 is a code converted for the status value of '2', that is if an output signal of the AND gate 34 is "0", the decision circuit 35 outputs the 8-bit signal received from the first table ROM for decoding 32 as an output signal. If the 16-bit code entering the AND gate 34 is a code converted for the status value of '3', that is if an output signal of the AND gate 34 is "1", the decision circuit 35 outputs the 8-bit signal received from the second table ROM for decoding 33 as an output signal.

A specified embodiment in which the code conversion method according to the present invention is applied to the above-described decoder configuration, that is the code conversion method in which a 17-bit code resulting from addition of one status bit to the 16-bit code, is transiently converted into 10 bits so as to be then converted into 8-bit data, is now explained by referring to the drawings.

Figure 5:
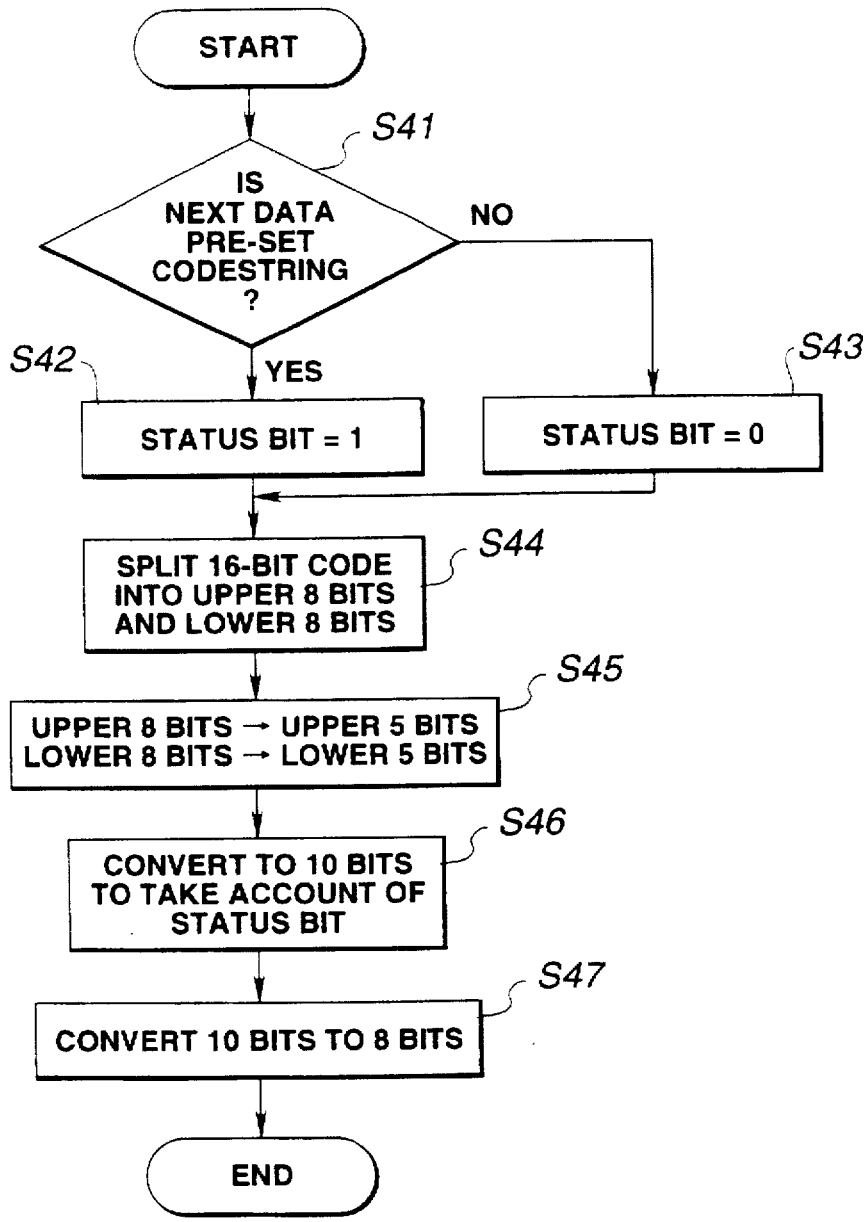
FIG. 5 is a flowchart for illustrating an example of the code conversion method embodying the present invention.

The flowchart of FIG. 5 shows example in which, in the flowchart of FIG. 1, n=16, m=8 and k=n−k=8.

At the first step S41 in FIG. 5, it is judged whether or not the 16-bit code immediately following the above-mentioned 16-bit code to be converted is a pre-set first codestring, that is whether or not at least one of the first and thirteenth bits of the next following 16-bit code is equal to 1. If the result of judgment is NO, processing transfers to step S43 where the status bit is set to 0, after which processing transfers to step S44. At step S44, the 16-bit code to be converted is split into upper 8 bits and lower 8 bits. At the next step S45, the upper 8 bits and the lower 8 bits are converted into respective 5 bits. At the next step S46, respective five bits associated with the above-mentioned upper and lower 8 bits, and the one status bit, totalling 11 bits, are converted to 10 bits.

At the next step S47, the 10 bits are converted into the original 8 bit data.

Figure 6:
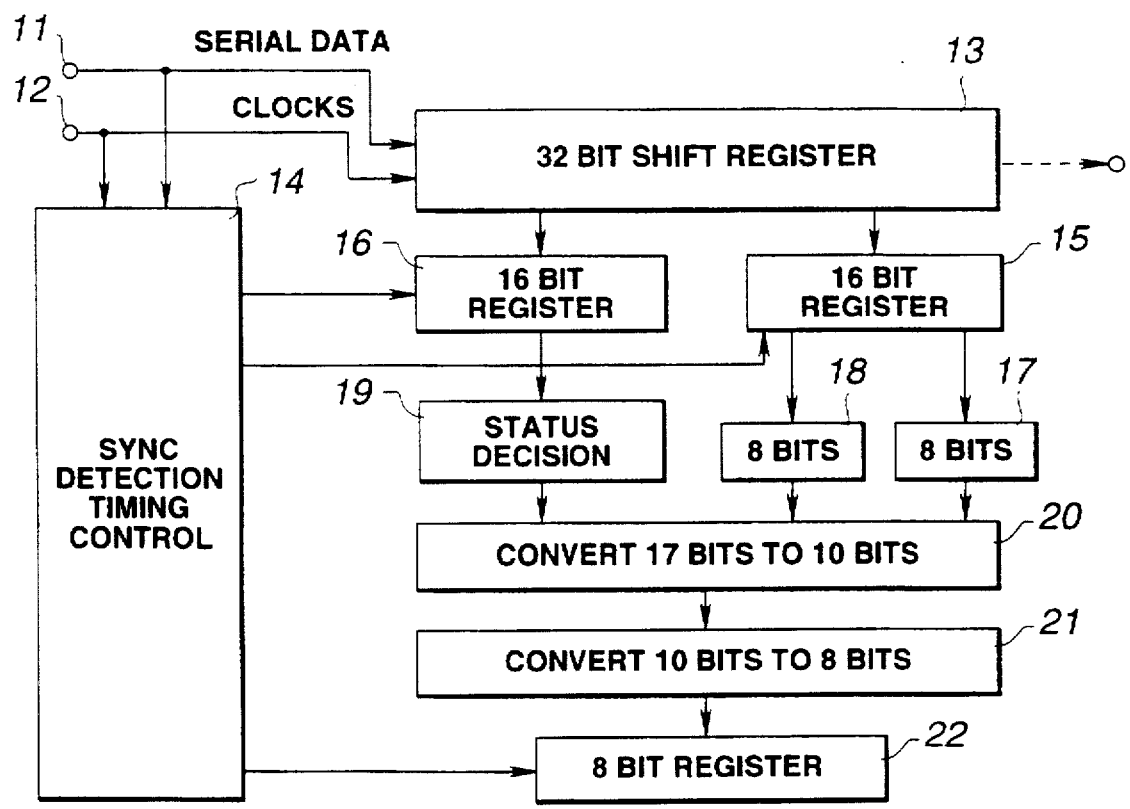
FIG. 6 is a block diagram showing an illustrative structure for implementing the code conversion method embodying the present invention.

The above may be represented by a block diagram of FIG. 6.

In this figure, 16-bit code serial data is supplied to an input terminal 11, while clocks are supplied to an input terminal 12. These serial data and clocks are sent to a 32-bit register 13 and to a synchronization detection and timing control circuit 14. Of the two 16-bit codes, stored in the 32-bit shift register 16, the 16-bit code, now to be converted, is stored in the 16-bit register 15, while the next 16-bit code is stored in the 16 bit register 16. These 16-bit registers 15, 16 are controlled the synchronization detection timing controlling circuit 14. The upper 8 bits and the lower 8 bits of the 16-bit code from the 16-bit register 15, now to be converted, are sent respectively via 8-bit shift registers 17 and 18 to a 17 to 10 bit conversion circuit 20. The 16-bit code, immediately following the 16 bit code, to be converted, is sent to a status decision circuit 19 where the status bit is set to 1 or 0 before being sent to the 17 to 10 bit conversion circuit 20. The 17 to 10 bit conversion circuit 20 converts the upper and lower 8 bits of the 16-bit code, now to be converted, and the status bit, totalling 17 bits, to 10 bits, which are sent to a 10 to 8 bit conversion circuit 21 for conversion to the original 8-bit data. An output of the 10 to 8 bit conversion circuit 21 is sent to an 8-bit register 22 which is controlled by an output of the synchronization detection timing control circuit 14.

Figure 7:
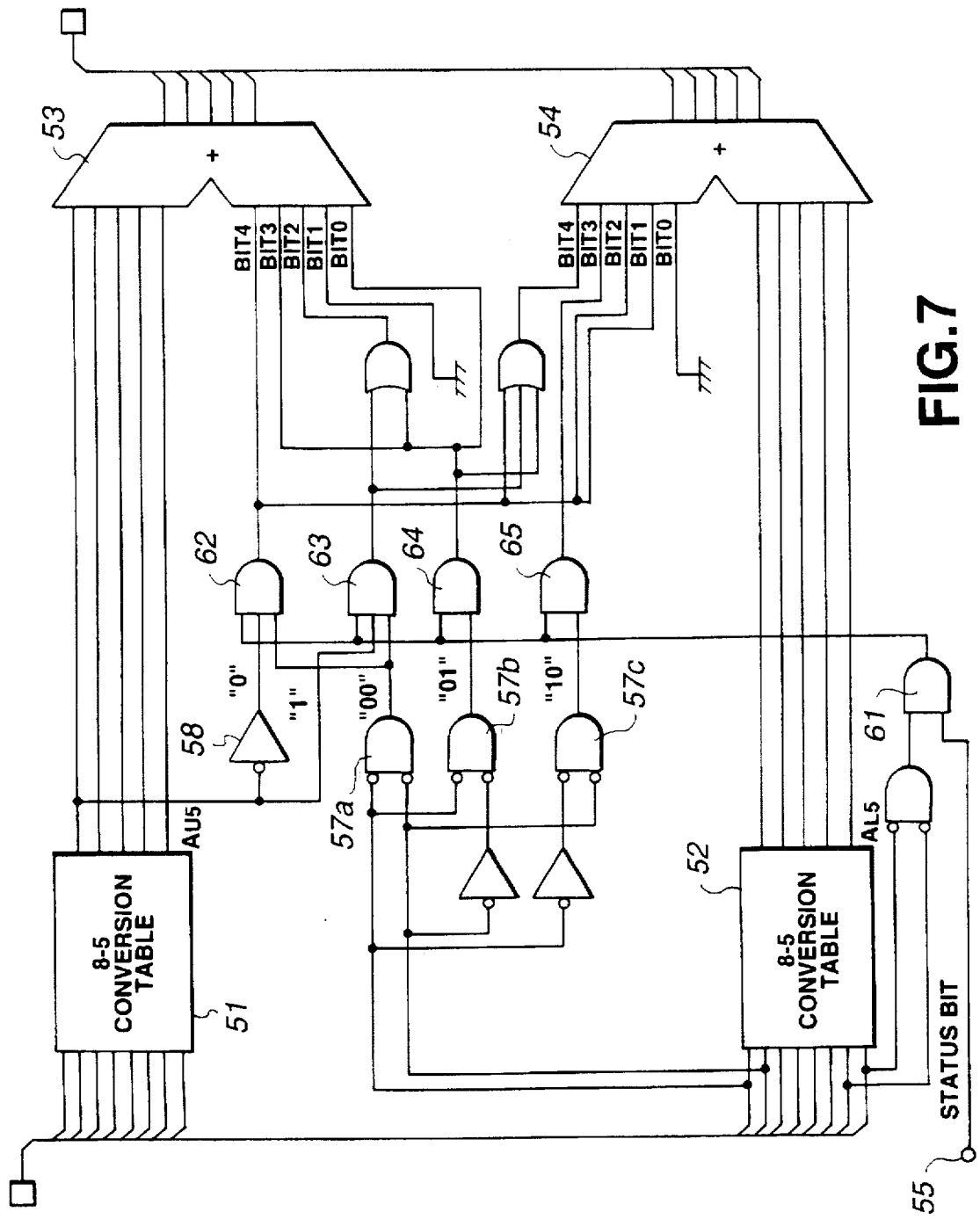
FIG. 7 is a block circuit diagram showing an illustrative example of a 17 to 10 bit conversion circuit 20 in the arrangement of FIG. 16.

The 17 to 10 bit conversion circuit 20 is configured as shown for example in FIG. 7. A conversion table 51 for converting upper 8 bits to 5 bits is configured as shown for example in FIG. 8A, while a conversion table 52 for converting lower 8 bits to 5 bits is configured as shown for example FIG. 8B in FIG. 8. In these tables 8A and 8B, the contents of the 8 bits are represented by binary numbers, whereas those of the 5 bits are represented by decimal numbers. The 5-bit outputs of these conversion tables 51, 52 are sent to adders 53, 54, respectively. To these adders 53, 54 are sent a previous status bit from a terminal 55 and a 5-bit value obtained on logical calculations responsive to the values of pre-set bits of the 16-bit code now to be converted.

Figure 9:
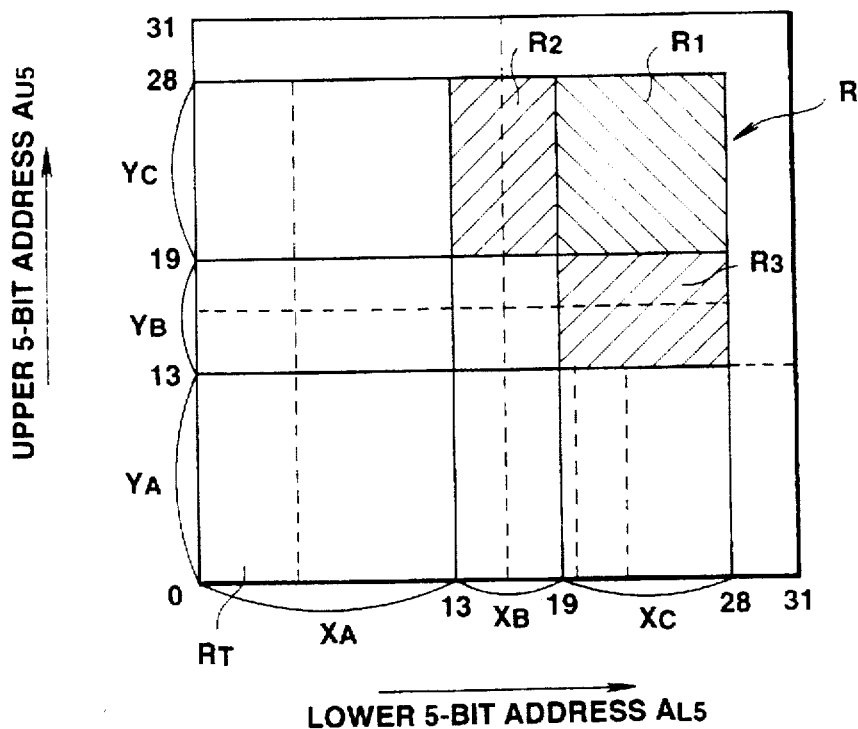
FIG. 9 shows a basic structure of a 10 to 8 bit conversion table for converting 10 bits made up of upper 5-bit addresses $A_{U5}$ and lower 5-bit addresses $A_{L5}$ into 8 bits.
Figure 10:
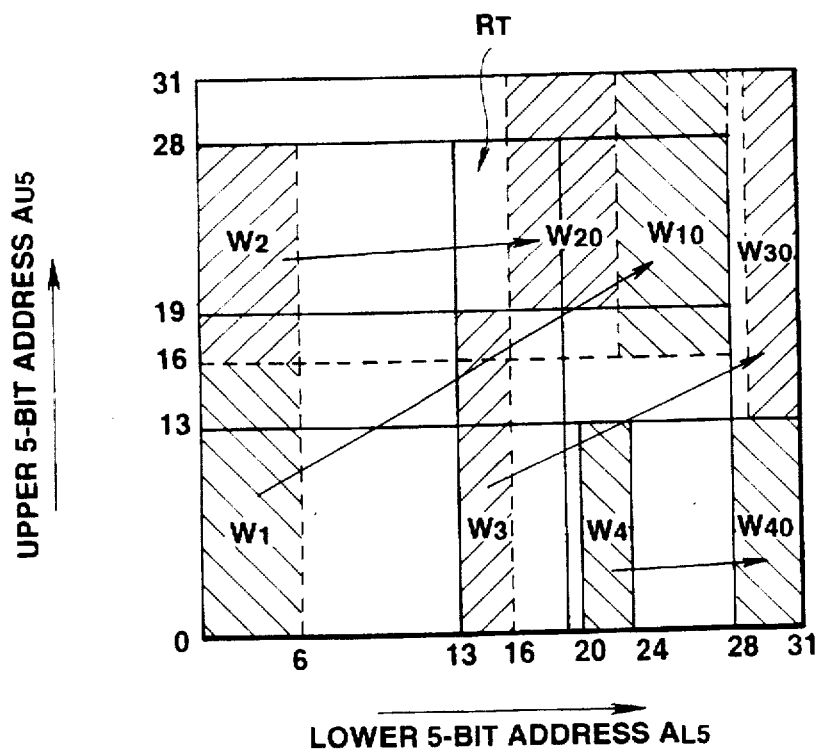
FIG. 10 shows an illustrative structure of a 10 to 8 bit conversion table for converting 10 bits made up of upper 5-bit addresses $A_{U5}$ and lower 5-bit addresses $A_{L5}$ into 8 bits.
Figure 11:
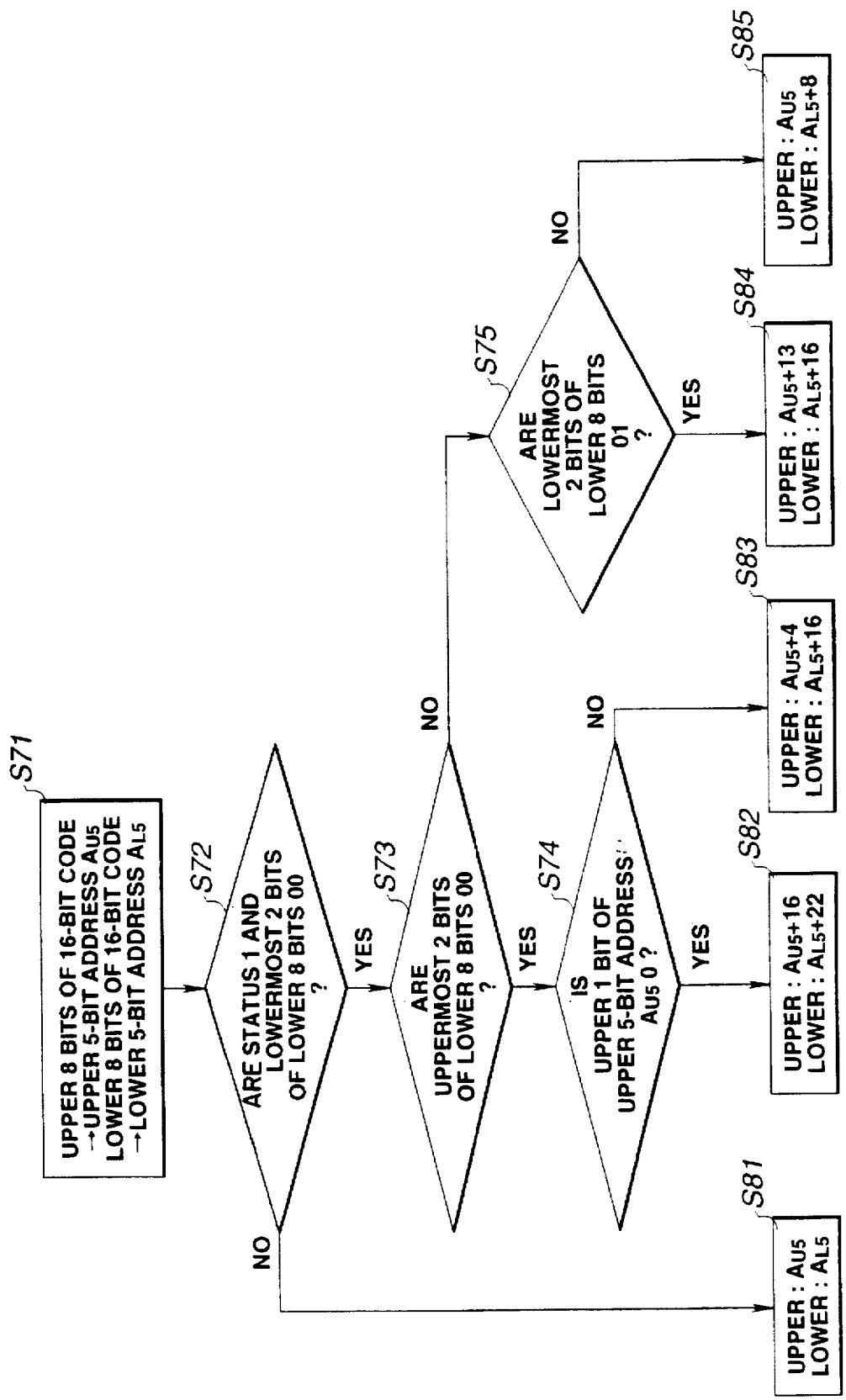
FIG. 11 is a flowchart for illustrating the operation of 17 to 10 bit conversion for converting 17 bits made up of 16 bit codes and a status bit into 10 bits made up of upper 5-bit addresses $A_{U5}$ and lower 5-bit addresses $A_{L5}$.

These logical calculations are designed for implementing conversion in accordance with a memory map of the 10 to 8 conversion table shown in FIGS. 9 and 10, and may be implemented by software by a flowchart shown in FIG. 11.

Referring first to the memory map of the 10 to 8 conversion table shown in FIG. 9, the map as a whole represents a memory space in which upper 5 bits (0 to 31) and lower 5 bits (0 to 31) are denoted by addresses $A_{US}$ and $A_{LS}$, respectively, and in which the 8-bit data as the original source data is designated by the 10-bit addresses. Under the above-mentioned minimum run-length limitations, there are only 28 patterns for each of the upper 8 bits and lower 8 bits of the 16-bit codes, as shown by the tables FIGS. 8A and 8B of FIG. 8, so that only an area R surrounded by a thick line is effective in the memory space of FIG. 9. Although the upper and lower 8 bits are represented as separate codes, these upper and lower 8 bits can be connected to each other, in which case it becomes necessary to provide two or more contiguous "0"s. From this it follows that the combination of a portion Yc in which the lower two bits in the table of FIG. 8A become "01" and a portion Xc in which upper two bits in the table of FIG. 8B become "10", the combination of the portion Yc in which the lower two bits in the table of FIG. 8A become "01" and a portion $X_B$ in which upper two bits in the table of FIG. 8B become "01" or the combination of a portion $Y_B$ in which the lower two bits in the table of FIG.

8A become "10" and the portion Xc in which upper two bits in the table of FIG. 8B become "10", do not exist, so that regions $R_1$, $R_2$ or the region $R_3$ shown shaded in the memory map of FIG. 9 become unneeded portions as conversion table. That is, only a region $R_T$, corresponding to a region R less the regions $R_1$, $R_2$ and $R_3$, is needed for the 10-8 conversion table.

In the above-described modulation method, a 16-bit code can be demodulated in two ways if the lower 2 bits thereof are "00". The addresses in which the lowermost two bits of the lower 8 bits resulting from code splitting become "00" may be searched in the table 8B of FIG. 8. These addresses are identified by 0 to 5, 13 to 15 and 20 to 23 of the 5-bit value. In FIG. 10, these addresses are shaded portions $W_1$, $W_2$, $W_3$ and $W_4$.

By shifting these address regions $W_1$, $W_2$, $W_3$ and $W_4$ to regions other than the region $R_T$, that is by shifting the regions $W_1$, $W_2$, $W_3$ and $W_4$ to regions $W_{10}$, $W_{20}$, $W_{30}$ and $W_{40}$, respectively, as indicated by arrow in FIG. 10, data of the region $W_T$ of FIG. 9 can be directly employed, such that 10 to 8 bit conversion taking the status bit into account can be executed by a sole 10-8 conversion table inclusive of table portions modulated in two ways.

The storage space can be reduced to one half of that when two 10-8 conversion tables are provided and changed over depending on the status bit. Specifically, a $8 \times 2^{10} = 8192$ or 8 kbit ROM suffices.

The method for formulating a sole 10-8 conversion table inclusive of the table portions demodulated in two ways is now explained. Of the 8-bit data demodulated in two ways from the same 16-bit code is termed separate selected data.

First, data associated with the region $R_T$ of FIG. 9, and which are demodulated when the status bit is "0", is written in the 10 bit address 8 bit data conversion table.

The separate selection data associated with the region $W_1$, for which an address $A_{LS}$ of lower 5 bits of a 10-bit address is such that $0 \leq A_{LS} < 6$, corresponding to a portion of a region $X_A$ in Table FIG. 8B of FIG. 8 in which upper two bits of the lower 8 bit code are "00" and lower 2 bits are "00", and for which an address $A_{US}$ is such that $0 \leq A_{US} < 15$, corresponding to a portion with the uppermost bit of the upper 5-bit address $A_{US}$ equal to "0", is written in the region $W_{10}$. To this end, it suffices to set the uppermost bit of the upper 5 bits of the 10-bit address accessing the data of the region $W_1$ to "1", that is to set the address for the upper 5 bits to $A_{US}+16$, and to add 22 to the lower 5 bits, that is to set the address for the lower 5 bits to $A_{LS}+22$, in writing the separate selection data.

The separate selection data associated with the region $W_2$, for which the address $A_{LS}$ for lower 5 bits of the 10-bit address is such that $0 \leq A_{LS} < 6$ and for which the uppermost bit of the upper 5 bits is "1", that is $16 \leq A_{US} < 27$, is written in the region $W_{20}$ of FIG. 10. To this end, it suffices to add 4 to the upper 5 bits of the 10-bit address accessing the data of the region $W_2$, that is to set the address for the upper 5 bits to $A_{US}+4$, and to set the uppermost bit of the lower 5 bits to "1", that is to set the address for the lower 5 bits to $A_{LS}+16$, in writing the separate selection data.

The separate selection data associated with a region $W_3$, for which the address $A_{LS}$ for lower 5 bits of the 10-bit address is such that $0 \leq A_{LS} < 16$ and for which the address $A_{US}$ for the upper 5 bits, being in the region $R_T$ as described above, is such that $0 \leq A_{US} < 19$, is written in the region $W_{30}$ of FIG. 10. To this end, it suffices to add 13 to the upper 5 bits of the 10-bit address accessing the data of the region $W_3$, that is to set the address for the upper 5 bits to $A_{US}+4$, and to set the uppermost bit of the lower 5 bits to "1", that is to set the address for the lower 5 bits to $A_{LS}+16$, in writing the separate selection data.

The separate selection data associated with the region $W_4$, for which the address $A_{LS}$ for lower 5 bits of the 10-bit address is such that $20 \leq A_{LS} < 24$ and for which the address $A_{US}$ for the upper 5 bits, being in the region $R_T$ as described above, is such that $0 \leq A_{US} < 13$, is written in the region $W_{40}$ of FIG. 10. To this end, it suffices to leave the upper 5 bits of the 10-bit address accessing the data of the region $W_4$ unchanged and to set the upper two bits "10" of the lower 5 bits of the 10-bit address to "11", that is to set the address for the lower 5 bits to $A_{LS}+8$, in writing the separate selection data.

By the above operations, the 10-8 conversion table is completed.

Referring to FIG. 11, conversion from 17 as-demodulated bits (16 code bits plus a status bit) to 10 bits is explained.

At the first step S71 in FIG. 11, upper 8 bits of the 16-bit code of the 17 bits are converted into an upper 5-bit address $A_{US}$, while lower 8 bits thereof are converted into a lower 5-bit address $A_{LS}$. At the next step S72, it is checked whether or not the status bit is 1 and the lowermost two bits of the lower 8 bits of the 16-bit code are "00". At this step S81, the upper and lower 5-bit addresses $A_{US}$, $A_{LS}$ are used unchanged. This is equivalent to accessing the region $R_T$ of the conversion table of FIG. 10.

If the result of decision at step S72 is YES, processing transfers to step S73 where it is judged if the upper two bits of the lower 8 bits of the 16-bit code are 00. If the result of decision is YES, processing transfers to step S74 and, if otherwise, processing transfers to step S75.

At step S74, it is judged whether or not the uppermost bit of the upper 5-bit address $A_{US}$ is "0". If the result of decision is YES, processing transfers to step S82 and, if otherwise, processing transfers to step S83. At step S82, 16 is added to the upper 5-bit address $A_{US}$, while 22 is added to the lower 5-bit address $A_{LS}$, for converting the addresses for the region $W_1$ into those for the region $W_{10}$ of FIG. 10. At step S83, 4 is added to the upper 5-bit address $A_{US}$, while 16 is added to the lower 5-bit address $A_{LS}$, for converting the addresses for the region $W_2$ into those for the region $W_{20}$ of FIG. 10.

At step S75, it is judged whether or not the upper two bits of the lower 5-bit address $A_{LS}$ are "01". If the result of decision is YES, processing transfers to step S84 and, if otherwise, processing transfers to step S85. At step S84, 13 is added to the upper 5-bit address $A_{US}$, while 16 is added to the lower 5-bit address $A_{LS}$, for converting the addresses for the region $W_3$ into those for the region $W_{30}$ of FIG. 10. At step S85, the upper 5-bit address $A_{US}$ is left unchanged, while 8 is added to the lower 5-bit address $A_{LS}$, for converting the addresses for the region $W_4$ into those for the region $W_{40}$ of FIG. 10.

FIG. 7 shows a configuration for realizing the operation of the above-explained flowchart by hardware.

In FIG. 7, the operation of converting the upper and lower 8 bits of the 16-bit code at step S71 of FIG. 11 into the addresses $A_{US}$ and $A_{LS}$ of the upper and lower 5 bits is performed by the conversion tables 51, 52. In FIG. 7, an AND gate 61 corresponds to step S72 of FIG. 11. An output of the AND gate 61 is "1" when the status bit is "1" and lowermost two bits of the lower 8 bits of the 16-bit code are "00". Outputs of AND gates with inverted inputs 57a, 57b and 57c are "1" when the upper two bits of the lower 8 bits of the 16-bit code are "00", "01", "10". An output of a gate with inverted input 58 becomes "1" when the uppermost bit of the upper 5-bit address $A_{US}$ form the conversion table 51 is "0".

In FIG. 7, AND gates 62 to 65 send pre-set values to the adders 53, 54 depending on conditions for adding the values to the respective addresses $A_{U5}$, $A_{L5}$ of the lower 5 bits. The contents of addition by the adders 53, 54 correspond to steps S82 to S85, respectively. Outputs of the adders 53, 54 are sent to the 10-8 bit conversion circuit 21 of FIG. 6 for accessing the conversion table of the memory map shown in FIG. 10 for demodulating or decoding 8-bit source data. The respective bits of the addition input to the adders 53, 54 are BIT0 to BIT4, looking from the lowermost bit.

That is, the AND gate 62 outputs "1" when the results of decision at steps S73 and S74 of FIG. 11 are YES. Thus the AND gate 62 sets the uppermost bit BIT4 of a sum input to the adder 53 for the upper 5-bit address $A_{U5}$ to "1" for setting $A_{U5}$+16. In addition, the AND gate 62 sets sum inputs BIT1, BIT2 and BIT4 to the adder 54 to "1" for the lower 5-bit address $A_{L5}$ to "1" for setting $A_{L5}$+22. The AND gate 63 outputs "1" under a condition in which the result of decision at step S75 in FIG. 11 becomes NO. In addition, the AND gate 63 sets addition inputs BIT0, BIT2 and BIT3 to the adder 53 to "1" for setting $A_{L5}$+13. The AND gate 63 also sets the addition input to the adder 54 BIT4 to "1" for setting $A_{L5}$+16. Moreover, the AND gate 65 sets BIT3 of the addition input to the adder 54 to 21" for setting $A_{L5}$+8.

The above may be summarized as follows:
1. If the status bit is "0", or the lowermost two bits of the lower 8 bits of a 16-bit code are not "00", the upper 5-bit address $A_{U5}$ and the lower 5-bit address $A_{L5}$ are used unchanged (step S81);
2. If the status bit is "1", the lowermost two bits of the lower 8 bits of the 16-bit code are "00", the lower 5-bit address $A_{L5}$ is such that $0 \leq A_{L5} < 13$ and the uppermost bit of the upper 5-bit address $A_{U5}$ is "0", the upper and lower 5-bit addresses are set to $A_{U5}$+16 and $A_{L5}$+22, respectively (step S82, AND gate 62);
3. If the status bit is "1", the lowermost two bits of the lower 8 bits of the 16-bit code are "00", the lower 5-bit address $A_{L5}$ is such that $0 \leq A_{L5} < 13$ and the uppermost bit of the upper 5-bit address $A_{U5}$ is "1", the upper and lower 5-bit addresses are set to $A_{U5}$+4 and $A_{L5}$+16, respectively (step S83, AND gate 63);
4. If the status bit is "1", the lowermost two bits of the lower 8 bits of the 16-bit code are "00", and the lower 5-bit address $A_{L5}$ is such that $13 \leq A_{L5} < 19$, the upper and lower 5-bit addresses are set to $A_{U5}$+13 and $A_{L5}$+16, respectively (step S84, AND gate 64); and
5. If the status bit is "1", the lowermost two bits of the lower 8 bits of the 16-bit code are "00", and the lower 5-bit address $A_{L5}$ is such that $19 \leq A_{L5} < 28$, the upper and lower 5-bit addresses are set to $A_{U5}$ and $A_{L5}$+8, respectively (step S85, AND gate 65).

The decoding sequence for several illustrative 16-bit codes will now be explained.

It is assumed that the current 16-bit code is "0001 0000 0000 0100", and the status bit is "1", that is at least one of the first and the thirteenth bits as counted from the MSB of the next 16-bit code is "1". Since the upper 5-bit address $A_{U5}$ is 4 (="00100") from the table A of FIG. 8A, insofar as the upper 8 bits are concerned, while the lower 5-bit address $A_{L5}$ is 1 (="00001") from the table B of FIG. 8B, insofar as the lower 8 bits are concerned. In addition, the status bit is 1". Therefore, the region $W_{10}$ on the memory of FIG. 10 should be accessed for conversion into 8-bit data. In the flowchart of FIG. 11, the lowermost two bits of the lower 8 bits are "00" and the status bit is "1", so that the result of decision at step S72 is "YES". The upper two bits of the lower 8 bits are "00", so that the result of decision at step S73 is YES.

On the other hand, since the uppermost bit of the upper 5-bit address $A_{U5}$ is "0", the result of decision at step S74 is YES and hence processing transfers to step S82 for decoding the region $W_{10}$. On the other hand, in the block circuit diagram of FIG. 7, an output of the AND gate 61 becomes "1", while outputs of the AND gates 62–65 become "1", so that the adders 53 and 54 output $A_{U5}$+16 and $A_{L5}$+22, respectively, for accessing the region $W_{10}$ of the conversion table.

It is assumed next that the current 16-bit code is "0001 0000 0000 0100", and the status bit is "0", that is both the first bit and the thirteenth bit as counted from the MSB of the next 16-bit code are "0". Since the upper 5-bit address $A_{U5}$ is 4 (="00100") from the table 8A of FIG. 8, while the lower 5-bit address $A_{L5}$ is 1 (="00001") from the table B of FIG. 8B. In addition, the status bit is "0". Therefore, the region $W_1$ on the memory of FIG. 10 should be accessed for conversion into 8-bit data. In the flowchart of FIG. 11, the lowermost two bits of the lower 8 bits are "00" and the status bit is "0", so that the result of decision at step S72 is "NO" such that processing transfers to step S81 for decoding the region $W_1$. On the other hand, in the block circuit diagram of FIG. 7, an output of the AND gate 61 becomes "0", while outputs of the AND gates 62 to 65 become "0", and hence the adders 53 and 54 output $A_{U5}$ and $A_{L5}$ for accessing the region $W_1$ of the conversion table, respectively.

It is further assumed next that the current 16-bit code is "0001 0000 0001 0010", and the status bit is "1", that is at least one of the first bit and the thirteenth bit as counted from the MSB of the next 16-bit code is "1". Since the upper 5-bit address $A_{U5}$ is 4 (="00100") from the table A of FIG. 8A, while the lower 5-bit address $A_{L5}$ is 10 (="01010") from the table 8B of FIG. 8B. In addition, the status bit is "1". However, this case corresponds to a region other than a hatched portion on the memory map of FIG. 10. Therefore, the region $R_T$ should be uniquely accessed for conversion into 8-bit data. In the flowchart of FIG. 11, since the lowermost two bits of the lower 8 bits are "10", the result of decision at step S72 is NO even though the status bit is "1". Processing transfers to step S81 for accessing the region $R_T$, with the upper and lower 5-bit addresses remain unchanged at $A_{U5}$ and $A_{L5}$, respectively. In the block diagram of FIG. 7, since an output of the AND gate 61 becomes "0", outputs of the AND gates 62 to 65 become all "0", such that the adders 53, 54 output $A_{U5}$ and $A_{L5}$, respectively.

The above-described embodiments of the present invention are preferably employed in particular for modulation and demodulation in recording the digital speech or data on a high-density optical disc. The signal format for such high-density optical disc may include a type of an eight-to-fourteen modulation system as a modulation system, a channel bit rate of 24.4314 Mbps, an error correction system of CIRC and a data transmission rate of 12.216 Mbps.

The present invention is not limited to the above-described embodiments. For example, the numerical values for n-bit codes and m-bit data may be arbitrarily set without being limited to n=16 or m=8.

We claim:

1. A code conversion method for uniquely converting n-bit codes to respective m-bit data values, where n>m, and n, m are positive integers, said n-bit codes including at least one n-bit code that corresponds to at least first and second m-bit data values, said code conversion method comprising the steps of:

detecting whether another n-bit code immediately following said one n-bit code is a predetermined codestring;
   generating a status bit indicating whether said one n-bit code corresponds to one of said first and second m-bit data values based on the detecting of said predetermined codestring;

dividing said one n-bit code into first and second codes, said first code containing a successive predetermined number of bits including a most significant bit of said one n-bit code, said second code containing the remaining successive bits of said one n-bit code;

generating an address value to access a conversion table containing said first and second m-bit data values by combining a first address value corresponding to said first code and a second address value corresponding to said second code, the generated address value being modified on the basis of said status bit; and obtaining one of said first and second m-bit data values corresponding to the modified address value such that said one n-bit code is selectively converted to one of said first and second m-bit data values.

2. The method according to claim 1, wherein said conversion table has first and second portions and is populated with said first and second m-bit data values, said first m-bit data value being allocated to said first portion, said second portion being accessed via addresses corresponding to unusable codes that have not satisfied a minimum run-length requirement of the n-bit codes and containing said second m-bit data value that replaces a corresponding one of said previously unusable codes.

3. The method according to claim 1, further comprising the step of determining whether an n-bit code selected for conversion corresponds to only one m-bit data value.

4. The method according to claim 1, wherein said first and second address values have less number of bits than said first and second codes, respectively.

5. A code conversion method for uniquely converting 16-bit codes to respective 8-bit data values, said 16-bit codes including at least one 16-bit code that corresponds to at least first and second 8-bit data values, said code conversion method comprising the steps of:

detecting whether another 16-bit code immediately following said one 16-bit code is a predetermined codestring;

generating a status bit indicating that said one 16-bit code corresponds to said first 8-bit data value if said another 16-bit code is said predetermined codestring;

dividing said one 16-bit code into first and second codes of 8 bits each;

generating an address value to access a conversion table containing said first and second 8-bit data values by combining a first address value corresponding to said first code and a second address value corresponding to said second code, the generated address value being modified on the basis of said status bit; and obtaining one of said first and second 8-bit data values corresponding to the modified address value such that said one 16-bit code is selectively converted to one of said first and second 8-bit data values.

6. The method according to claim 5, wherein said status bit indicates that said one 16-bit code corresponds to said second 8-bit data value if said another 16-bit code is not said predetermined codestring.

7. The method according to claim 5, wherein said codestring is 8008 in a hexadecimal notation.

8. Code conversion apparatus including a conversion table for uniquely converting n-bit codes to respective m-bit data values, where n>m, and n, m are positive integers, said n-bit codes including at least one n-bit code that corresponds to at least first and second m-bit data values, said code conversion apparatus comprising:

means for detecting whether another n-bit code immediately following said one n-bit code is a predetermined codestring;

means for generating a status bit indicating whether said one n-bit code corresponds to one of said first and second m-bit data values in response to the detecting of said predetermined codestring;

means for dividing said one n-bit code into first and second codes, said first code containing a successive predetermined number of bits including a most significant bit of said one n-bit code, said second code containing the remaining successive bits of said one n-bit code;

means for combining a first address value corresponding to said first code and a second address value corresponding to said second code to generate an address value in said conversion table containing said first and second m-bit data values, the generated address value being further modified on the basis of said status bit; and means for obtaining one of said first and second m-bit data values corresponding to the modified address value such that said one n-bit code is selectively converted to one of said first and second m-bit data values.

* * * * *